US009875798B2

(12) United States Patent
La Rosa et al.

(10) Patent No.: US 9,875,798 B2
(45) Date of Patent: Jan. 23, 2018

(54) METHOD FOR MANAGING A FAIL ROW OF THE MEMORY PLANE OF A NON VOLATILE MEMORY AND CORRESPONDING MEMORY DEVICE

(71) Applicant: STMicroelectronics (Rousset) SAS, Rousset (FR)

(72) Inventors: Francesco La Rosa, Rousset (FR); Gineuve Alieri, Trapani (IT)

(73) Assignee: STMicroelectronics (Rousset) SAS, Rousset (FR)

( * ) Notice: Subject to any disclaimer, the term of this patent is extended or adjusted under 35 U.S.C. 154(b) by 1 day.

(21) Appl. No.: 15/140,856

(22) Filed: Apr. 28, 2016

(65) Prior Publication Data
US 2017/0162264 A1   Jun. 8, 2017

(30) Foreign Application Priority Data
Dec. 2, 2015   (FR) .................................... 15 61730

(51) Int. Cl.
| | | |
|---|---|---|
| *G11C 14/00* | (2006.01) | |
| *G11C 16/16* | (2006.01) | |
| *G11C 29/00* | (2006.01) | |
| *G11C 16/10* | (2006.01) | |
| *G11C 16/26* | (2006.01) | |

(52) U.S. Cl.
CPC .......... *G11C 14/0018* (2013.01); *G11C 16/10* (2013.01); *G11C 16/16* (2013.01); *G11C 16/26* (2013.01); *G11C 29/76* (2013.01); *G11C 29/785* (2013.01); *G11C 29/82* (2013.01); *G11C 29/84* (2013.01); *G11C 29/846* (2013.01)

(58) Field of Classification Search
CPC ............................ G11C 14/0018; G11C 16/10
USPC ...................................................... 365/185.08
See application file for complete search history.

(56) References Cited

U.S. PATENT DOCUMENTS

| | | | |
|---|---|---|---|
| 5,126,808 A | | 6/1992 | Montalvo et al. |
| 5,327,383 A | * | 7/1994 | Merchant ............... G11C 16/10 365/185.09 |
| 6,771,541 B1 | | 8/2004 | Park |
| 7,224,607 B2 | * | 5/2007 | Gonzalez .............. G06F 11/106 365/185.11 |
| 7,336,538 B2 | | 2/2008 | Crippa et al. |
| 8,687,421 B2 | * | 4/2014 | Avila .................. G06F 11/1048 365/185.02 |
| 2004/0130953 A1 | | 7/2004 | Ambroggi et al. |
| 2004/0145952 A1 | | 7/2004 | Chen et al. |

(Continued)

FOREIGN PATENT DOCUMENTS

WO         2007112202 A2    10/2007

*Primary Examiner* — Son Mai
*Assistant Examiner* — Muna A Techane
(74) *Attorney, Agent, or Firm* — Slater Matsil, LLP (57) ABSTRACT

A non-volatile memory is erasable by page and equipped with a row redundancy mechanism. In the case of the detection of a defective row of the memory plane, the storing of the address of the row in a non-volatile register is carried out and a redundant row having a new address is assigned. In the case of an attempt to write to the defective row, a write to the redundant row is carried out. When writing to the redundant row, the new content of the redundant row is loaded into a volatile memory and, following an operation for writing to any other row of the memory plane, a re-loading of the new content of the redundant row into the volatile memory.

23 Claims, 4 Drawing Sheets

(56) References Cited

U.S. PATENT DOCUMENTS

| | | |
|---|---|---|
| 2006/0034137 A1 | 2/2006 | Zanardi |
| 2006/0087893 A1* | 4/2006 | Nishihara ............ G06F 12/0246 |
| | | 365/145 |
| 2007/0109856 A1 | 5/2007 | Pellicone et al. |
| 2007/0195595 A1 | 8/2007 | Seo et al. |
| 2008/0065937 A1 | 3/2008 | Micheloni et al. |
| 2010/0107004 A1 | 4/2010 | Bottelli et al. |
| 2010/0161881 A1* | 6/2010 | Nagadomi .......... G06F 12/0246 |
| | | 711/103 |
| 2012/0246383 A1* | 9/2012 | Asano ................ G06F 11/1068 |
| | | 711/102 |

\* cited by examiner

METHOD FOR MANAGING A FAIL ROW OF THE MEMORY PLANE OF A NON VOLATILE MEMORY AND CORRESPONDING MEMORY DEVICE

This application claims priority to French Application No. 1561730, filed on Dec. 2, 2015, which application is hereby incorporated herein by reference.

TECHNICAL FIELD

Various embodiments of the invention and their implementation relate to non-volatile memories and, more particularly, memories that are erasable by page and are equipped with a row redundancy mechanism.

BACKGROUND

In operation, the memory plane of a non-volatile memory may be subject to short-circuits, for example, between the word-line and the substrate, owing notably to the large difference in potential applied during the erase operation. These short-circuits may be linked to a breakdown of the tunnel oxide or to a breakdown of the insulating spacers flanking the gate regions.

This may then result in defects in some sectors or in some rows of the non-volatile memory.

Row redundancy mechanisms exist which, when a defective row is detected, provide a replacement for this defective row by a redundant row.

One example of a redundancy mechanism for sectors of a non-volatile memory is, for example, described in the U.S. Patent Publication No. 2004/0130953.

SUMMARY

According to one embodiment and its implementation, an automatic redundancy mechanism is provided for rows or pages of a non-volatile memory operating during the normal operation of the memory and having a reduced, or even non-existent, impact on the access time for reading the memory.

According to one aspect, a method is provided for managing the operation of a non-volatile memory, erasable by page, and equipped with a row redundancy mechanism.

The method according to this aspect comprises, in the case of the detection of a defective row of the memory plane, the storing of the address of the row in a non-volatile register and the assignment of a redundant row having a new address, and, in the case of an attempt to write to the defective row, a write to the redundant row.

According to a general feature of this aspect, the method furthermore comprises, when writing to the redundant row, the loading of new content from the redundant row into a volatile memory, for example, a buffer memory of the RAM type, and, at the end of the operation for writing to any other row of the memory plane, a re-loading of the new content from the redundant row into the volatile memory.

Then, when a command is issued for reading the redundant row, the method comprises at least one read of the volatile memory so as to deliver the new content of the redundant row stored in the volatile memory.

In other words, this volatile memory, which is used as a row or page buffer memory during the operation for writing to the row (or page) since the data from the row are firstly transferred into the volatile memory prior to being written into the non-volatile memory, is loaded, during the writing to the redundant row, with the new content of this redundant row.

Furthermore, since, during the writing to any other row of the memory plane, the content of the volatile memory is overwritten, the content of the redundant row is re-loaded into the volatile memory.

Thus, the volatile memory is continually re-loaded with the content of the redundant row, except during the write operation itself to any other row of the memory plane.

Then, when a command is issued for reading the redundant row, the volatile memory are read so as to deliver the content of the redundant row which is stored, which is very advantageous because the access to the volatile memory is much faster than the access to the non-volatile memory.

In theory, it would not be necessary to carry out a re-load of the volatile memory with the new content of the redundant row after the redundant row has been written since the volatile memory already contains this content. However, for the purposes of simplification of the state machine, it is preferable for the method to also comprise a re-load of the new content of the redundant row into the volatile memory carried out after writing to the redundant row.

Generally speaking, a write operation in the non-volatile memory comprises an erase step followed by a programming step.

However, in certain cases, this write operation may comprise only an erase step or only a programming step.

Thus, if for example, the page to be written only contains "0"s, then only an erase step is needed.

Similarly, when all the words of the page are equal to 0F (in hexadecimal notation), and need to be replaced by the words 1F, then the erase step is unnecessary.

The method according to this aspect is advantageously applicable to a non-volatile memory configured such that the defective row does not affect the functionality of the other rows.

This is, for example, the case for a memory of the electrically-erasable programmable read-only memory (EEPROM) type erasable by page, or else a memory whose memory cells comprise a floating gate and a shared gate, namely a control gate and an erase gate, or else a non-volatile memory of the type of that described in the French Patent application no. 15 54163, whose columns of memory cells comprise two lines of bits and twin pairs of memory cells comprising a common selection gate, the twin adjacent memory cells of the same column not being connected to the same bit line, whereas the non-twin adjacent memory cells of the same column are connected to the same bit line. It is understood that these examples are not limiting.

According to another aspect, a memory device is provided comprising a non-volatile memory erasable by page, a row redundancy mechanism comprising at least one non-volatile register and a controller configured for, in the case of the detection of a defective row of the memory plane, storing the address of the row in the at least one non-volatile register and for, in the case of an attempt to write to the defective row, authorizing writing to a redundant row.

According to a general feature of this other aspect, the memory device also comprises a volatile memory and the controller is furthermore configured for: when writing to the redundant row, carrying out the storing of the new content of the redundant row in the volatile memory, and after an operation for writing to any other row of the memory plane, carrying out a new storing of the new content of the redundant row in the volatile memory, and when a read command is issued for the redundant row, enabling at least one read of the volatile memory so as to deliver the new content of the redundant row stored in the volatile memory.

According to one embodiment, the controller is also configured for carrying out a re-loading of the new content of the redundant row into the volatile memory after the redundant row has been written.

Generally speaking, read amplifiers are associated with the non-volatile memory and are usable during read operations in this non-volatile memory. In addition, according to one embodiment, the controller comprises a multiplexer having a first input connected to the non-volatile memory, a second input connected to the volatile memory, and a control block configured for, when a read command is issued for the redundant row, selecting the second input in a selection time shorter than the time for implementing the read amplifiers.

In other words, the multiplexer can be positioned very quickly and, in any case, well before the end of the read operations implemented by the read amplifiers.

BRIEF DESCRIPTION OF THE DRAWINGS

Other advantages and features of the invention will become apparent upon examining the detailed description of non-limiting embodiments and their implementation and from the appended drawings in which.

DETAILED DESCRIPTION OF ILLUSTRATIVE EMBODIMENTS

Figure 1:
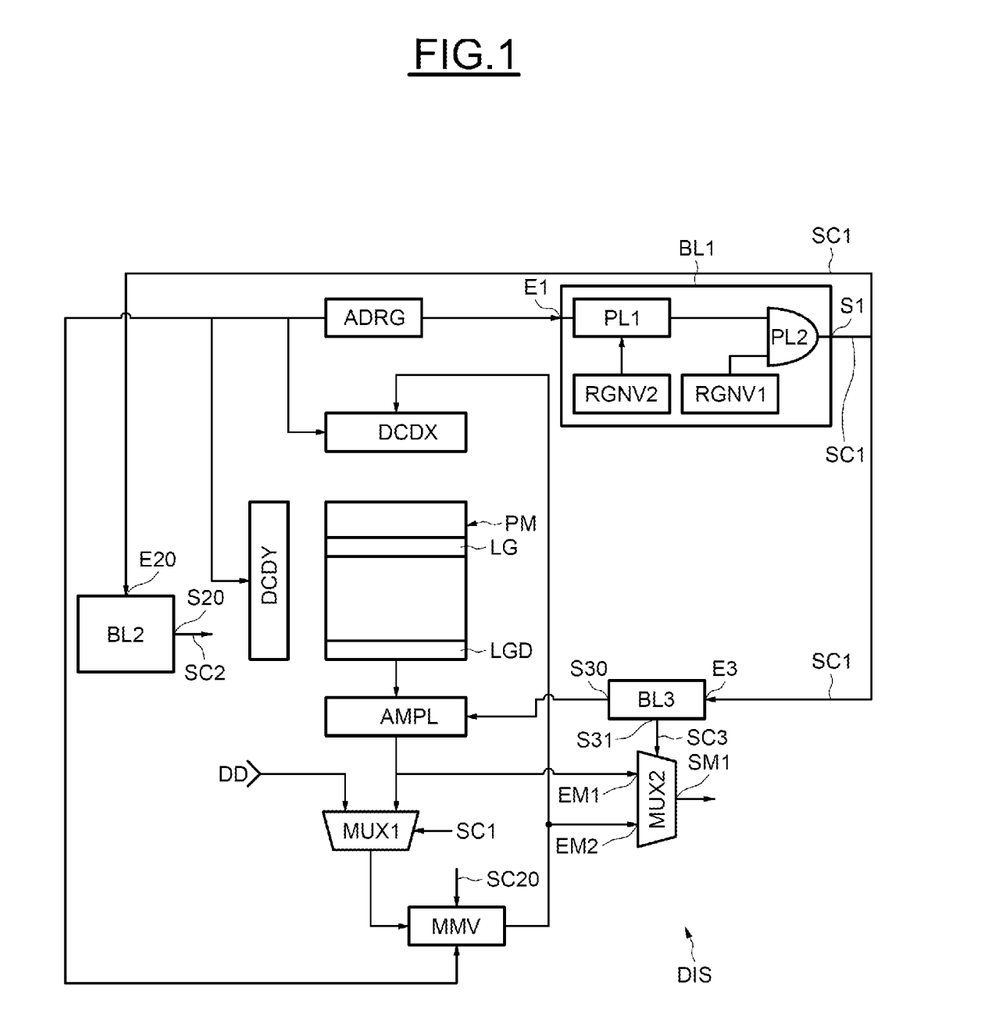
FIGS. 1 to 4 illustrate various embodiments of the invention and their implementation.

In FIG. 1, the reference DIS denotes a memory device comprising a memory plane PM of a non-volatile memory, conventionally comprising rows LG and columns.

In the present case, the memory plane PM is organized by page, each row LG forming one page of the memory.

The memory device DIS also conventionally comprises row and column decoders DCDY and DCDX, an address register ADRG together with read amplifiers AMPL.

In FIG. 1, for the sake of simplification of the figure, the read amplifiers AMPL have been shown underneath the memory plane PM with the decoder columns DCDX shown on top of the memory plane, whereas, in practice, the column decoder DCDX is of course disposed between the memory plane and the read amplifiers AMPL.

Other conventional and known circuits of a memory device, not useful for the understanding of the invention, are not shown here for the sake of simplification.

The memory plane PM also comprises at least one redundant row LGD (only one redundant row is shown here for the sake of simplification).

Indeed, during the operation of the memory, it is possible for a row LG of the memory plane to become defective subsequent for example to short-circuits occurring during the erase phase owing to large differences in potential applied to the memory cells during this erase phase.

The detection of a defective row, for example the row LG, is conventionally carried out in a manner known per se during the erase phase. By way of example, if, after the erase phase, it is observed that some memory cells of the row are not correctly erased, a erase operation is repeated and so on for several times, typically for around ten times.

If, at the end of this sequence, certain cells of the row LG are still not correctly erased, the row LG is then declared as being defective.

In order to manage any defective row or rows detected within the memory plane PM, the memory device DIS also comprises a row redundancy mechanism here comprising a first non-volatile register RGNV1 and a second non-volatile register RGNV2.

The register RGNV1 is designed to store as many bits as there are redundant rows, each bit being representative of the activation or not of the redundancy ("redundancy enabled") relating to the corresponding redundant row, whereas the register RGNV2 is designed to store the address of any row LG detected as being defective, it being of course understood that the register RGNV2 cannot contain more addresses of rows detected as being defective than there are redundant rows.

Although the two registers RGNV1 and RGNV2 have been shown in this example as two separate non-volatile registers, these two registers could be functionally combined within one and the same non-volatile register.

Aside from these non-volatile registers, the row redundancy mechanism comprises a controller represented in this example by three control blocks BL1, BL2, BL3, formed for example from logic gates and/or components, and whose function will be discussed in more detail hereinafter.

The memory device DIS also comprises a volatile memory MMV, for example of the RAM memory type.

This memory MMV is connected, on the one hand, to a data input DD and, on the other hand, to the output of the read amplifiers AMPL via a first multiplexer MUX1 controllable by a control signal SC1.

The output of the memory MMV is connected, on the one hand, to a second input EM2 of a second multiplexer MUX2 and, on the other hand, to the data register (not shown here for the sake of simplification) of the non-volatile memory.

The first input EM1 of the multiplexer MUX2 is connected to the output of the read amplifiers AMPL.

The multiplexer MUX2 is controlled by a control signal SC3 delivered by the output S31 of the control block BL3.

For this reason, the output SM1 of the multiplexer MUX2 is capable of delivering either the content of a row of the memory plane PM of the non-volatile memory or, as will be seen in more detail hereinafter, the content of the redundant row LGD assigned to a row LG detected as being defective.

Figure 2:
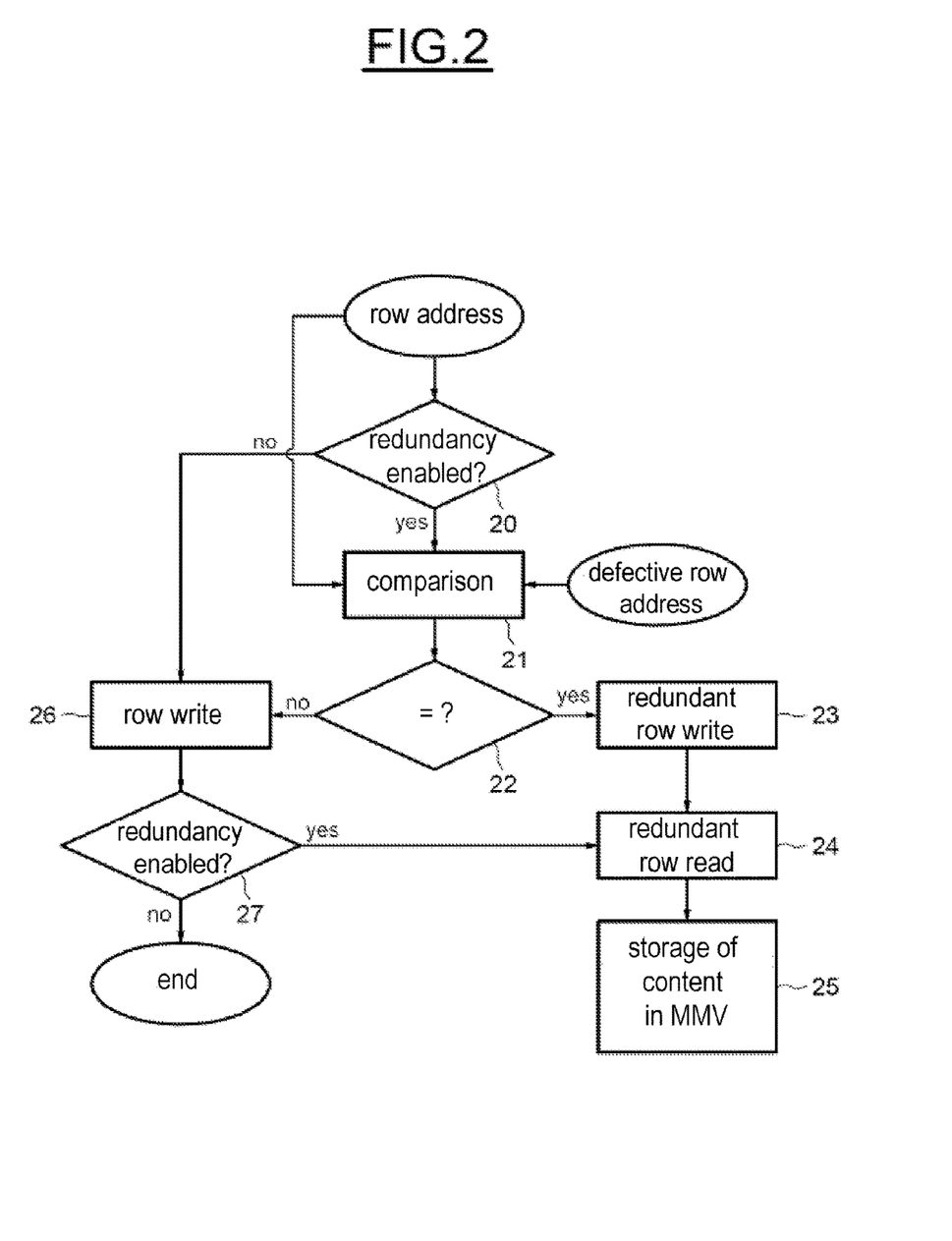
Figure 3:
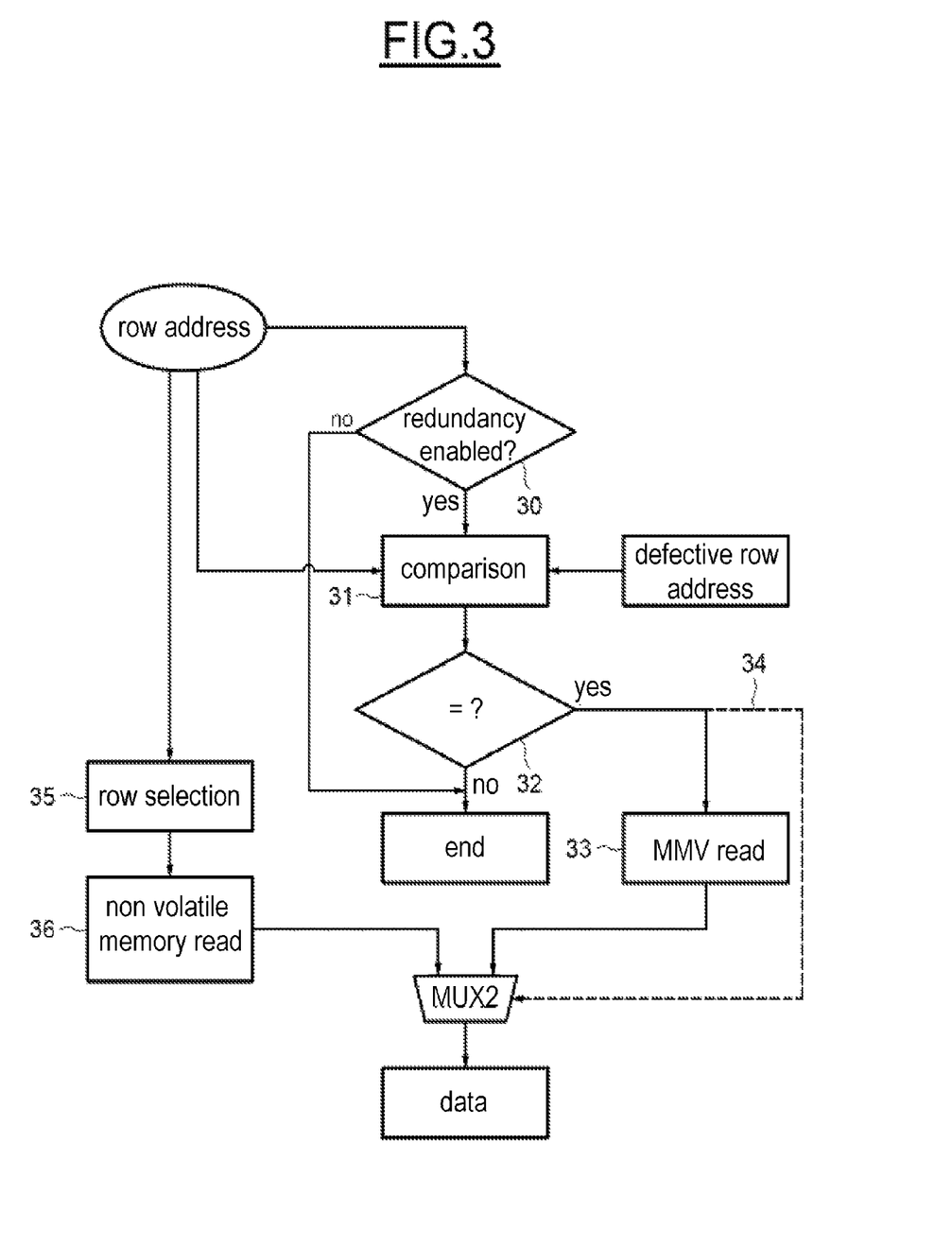

Reference is now more particularly made to FIGS. 2 and 3 in order to illustrate one embodiment of a method according to the invention.

In FIG. 2, the presence of a write command in a row of the memory plane PM is assumed.

In such a case, it is first of all verified whether the redundancy is enabled (step 20).

In other words, it is verified whether, previously, a row of the memory plane has already been considered as being defective.

By way of example, if the bit stored in the register RGNV1 is at "0", this means that the redundancy is not enabled, whereas if this bit is equal to 1, the redundancy is enabled.

In the case where the redundancy is not enabled, the output $S_1$ of the control block $BL_1$ is at zero since one of the two inputs of the AND logic gate, referenced $PL_2$ (FIG. 1), is at zero.

The control signal SC1 is received on the input E20 of the control block BL2 which delivers, on its output S20, a control signal SC2 configured for, in the present case, allowing the row decoder DCDY to carry out a decoding on the memory plane and not on the redundant row LGD.

For this purpose, the address of the row to be written is communicated to the row decoder DCDY and to the column decoder DCDX and the writing of the row is carried out in a conventional manner (step 26).

More precisely, the write operation here conventionally comprises an erase operation followed by a programming operation. During the programming, the data on the row to be written are transmitted via the data input DD and the multiplexer MUX1 to the volatile memory MMV which here acts as a buffer memory, and this data is subsequently written into the memory plane PM.

Since, in the step 27, the redundancy is not enabled, the method ends here.

In the case where the redundancy is enabled (step 20), the redundancy bit stored in the non-volatile register RGNV1 is at the logic state "1".

The following step 21 then comprises the comparison of the address of the row to be written with the address or addresses stored in the register RGNV2 and corresponding to a row address or row addresses detected as being defective.

For this purpose, as illustrated in FIG. 1, the block BL1 comprises for example an EXCLUSIVE NOR logic gate (XNOR gate), referenced PL1, for carrying out this comparison of addresses.

If the two addresses are identical, the output of the logic gate PL1 is at 1, whereas it is at 0 in the opposite case.

In the case where the address of the row to be written corresponds to the address of a defective row (step 22), then the redundant row LGD is written (step 23).

For this purpose, the control signal SC1 has the logical value 1 and the control signal SC2 this time, rather than allowing the memory plane PM to be addressed, allows the redundant row LGD to be directly addressed.

Here again, the new content of the redundant row LGD transits via the first multiplexer MUX1 and the volatile memory MMV prior to being written into the redundant row LGD.

Although not absolutely indispensable, for the sake of harmonization with the writing of the other rows of the memory plane, a re-loading is carried out of the content of the redundant row LGD into the volatile memory MMV following the operation for writing to this redundant row.

More precisely, as illustrated in FIG. 2, a read 24 of the redundant row LGD is carried out and, after having sent a suitable command to the first multiplexer MUX1 with the signal SC1, this content is loaded into the volatile memory MMV (step 25).

If, in the step 22, the result of the comparison is negative, in other words, if the row that it is desired to be written is not a defective row, then a conventional write operation 26 is carried out on the row as indicated hereinbefore.

On the other hand, since the redundancy has been enabled (step 27), and the content of the volatile memory MMV has been overwritten by the content of the row that has just been written, the volatile memory MMV needs to re-loaded again with the content of the redundant row following the writing 26 into the non-defective row.

Accordingly, a read 24 of the redundant row is again carried out then the storing of this content in the volatile memory MMV (step 25).

It is therefore noted that, except during the write operations, notably the programming phase, the volatile memory MMV is continually re-loaded with the content of the redundant row LGD.

Reference is now more particularly made to FIG. 3 in order to describe one example of reading of a row or page.

In the example which is illustrated here, whether the row is a defective row or not, its content is extracted from the non-volatile memory after having been selected in the memory plane (steps 35 and 36).

In parallel, in the step 30 it is verified whether the redundancy is enabled.

If the redundancy is not enabled, then the second multiplexer MUX2 is controlled in such a manner that its output SM1 is connected to its first input EM1 so as to deliver at the output the content of the row read in the non-volatile memory.

If the redundancy is enabled, a comparison 31 is carried out of the address of the row to be read with the addresses of the defective rows stored in the non-volatile register RGNV2.

If the address of the row to be read does not correspond to an address of a defective row, then the multiplexer MUX2 is here again controlled so as to deliver at the output the content of this row read from the non-volatile memory.

In the case where, in the step 32, the comparison is positive, in other words the address of the row to be read corresponds to the address of a defective row, then the content of the redundant row stored in the volatile memory MMV is read (step 33) and the multiplexer MUX2 is controlled using the signal SC3 in such a manner as to connect its output SM1 to its second input EM2 and consequently to deliver the content of the redundant row which has been stored in the memory device MMV.

It goes without saying that the reading of the memory device MMV takes place in response to a control signal SC20 which can also be delivered by the control block BL3.

It should be noted here that the read access to the volatile memory MMV is much faster than the read access to the non-volatile memory via the read amplifiers AMPL.

Furthermore, the delivery 34 of the control signal SC3 to the multiplexer MUX2 is very fast and, as a result, the positioning of the multiplexer MUX2 is carried out in a much shorter time than the duration of the read operations via the implementation of the read amplifiers AMPL.

As can be seen, in this embodiment, for a read command of a defective row, there are in fact two read operations which are carried out in parallel, namely a read of the defective row itself from the non-volatile memory by the enabling of the read amplifiers AMPL from the block BL3, and a read of the content of the redundant row using the non-volatile memory, only the latter content being selected.

It would be possible, as a variant, to forego the read of the defective row carried out using the non-volatile memory by simplifying for example the structure of the control block BL3 so as not to enable the read amplifiers AMPL.

The non-volatile memory is advantageously a memory configured such that the defective row does not affect the functionality of the other rows.

This may, for this purpose, be a memory of the EEPROM type erasable by page or else a memory whose memory cells comprise a floating gate and a shared gate, namely a control gate and an erase gate.

Figure 4:
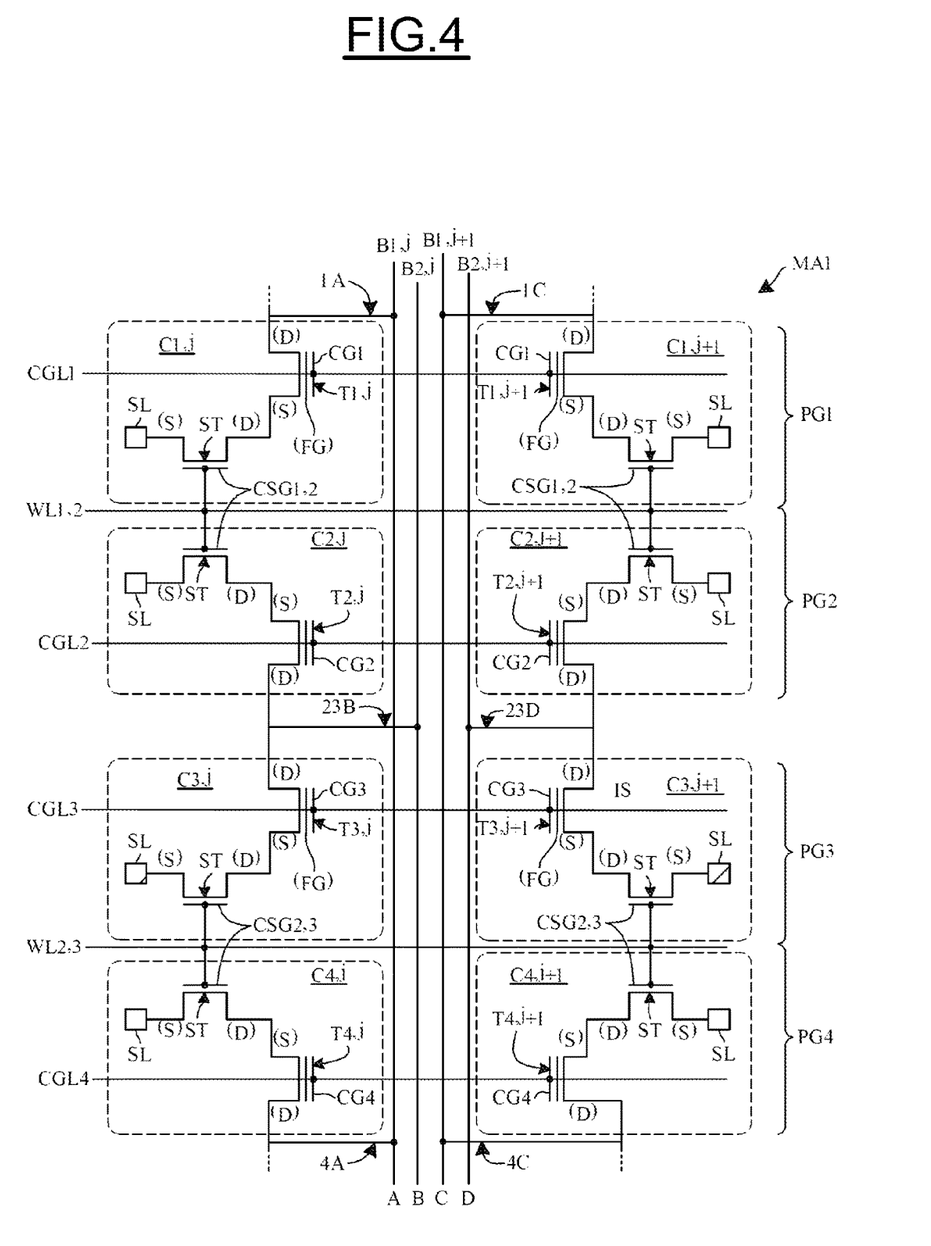

It may also consist of a non-volatile memory of the type of that described in the French Patent application no. 15 54163, Which is incorporated herein by reference. One embodiment of such a memory is illustrated in FIG. 4.

More precisely, the memory plane MA1 of such a memory comprises two bit lines per column of memory cells. Thus, two bit lines $B1,j$, $B2,j$ are allocated to the memory cells of the column of rank j, and two bit lines $B1,j+1$, $B2,j+1$ are allocated to the memory cells of the column of rank j+1.

Two twin memory cells are connected to different bit lines from between the two bit lines allocated to the column in which they are located, whereas two memory cells that are adjacent but non-twin are connected to the same bit line.

Thus, in the column of rank j:
the drain terminal (D) of the floating-gate transistor T1,j is connected to the bit line B1,j via a conducting track 1A,
the drain terminal of the floating-gate transistor T2,j is connected to the bit line B2,j via a conducting track 23B,
the drain terminal of the floating-gate transistor T3,j is connected to the bit line B2,j via the conducting track 23B (the memory cell C2,j being adjacent but not twin to the memory cell C3,j), and
the drain terminal of the floating-gate transistor T4,j is connected to the bit line B1,j via a conducting track 4A.

In the column of rank j+1:
the drain terminal of the floating-gate transistor T1,j+1 is connected to the bit line B1,j+1 via a conducting track 1C,
the drain terminal of the floating-gate transistor T2,j+1 is connected to the bit line B2,j+1 via a conducting track 23D,
the drain terminal of the floating-gate transistor T3,j+1 is connected to the bit line B2,j+1 via the conducting track 23D (the memory cell C2,j+1 being adjacent but not twin to the memory cell C3,j+1), and
the drain terminal of the floating-gate transistor T4,j+1 is connected to the bit line B1,j+1 via a conducting track 4C.

Each memory cell can thus be read independently of its twin memory cell by use of the bit line to which it is connected and to which its twin memory cell is not connected. For example, after selection of the twin memory cells C1,j, C2,j by use of a selection voltage applied to the word-line WL1,2, and after having applied a read voltage to the gate control line CGL1, the memory cell C1,j can be read via the bit line B1,j without it being necessary to apply a negative read inhibit voltage to the gate control line CGL2 of the twin memory cell C2,j since this memory cell is not connected to the bit line B1,j but to the bit line B2,j.

It should also be noted that the present invention is compatible with the invention described in the co-pending U.S. patent application filed the same day as the present U.S. patent application. The compatible application is entitled "Method for Managing a Fail Bit Line of a Memory Plane of a Non Volatile Memory and Corresponding Memory Device."

What is claimed is:

1. A method for managing operation of a non-volatile memory erasable by page and equipped with a row redundancy mechanism, the method comprising:
    detecting a defective row of a memory plane of the non-volatile memory;
    storing an address of the defective row in a non-volatile register memory;
    assigning a redundant row having a new address memory to the defective row;
    receiving an instruction to write a new content to the defective row;
    writing the new content to the redundant row;
    loading the new content of the redundant row into a volatile memory;
    following each write operation to any other row of the memory plane, re-loading of the new content of the redundant row into the volatile memory;
    receiving a read command for the redundant row; and
    in response to the read command, reading the volatile memory so as to deliver the new content of the redundant row stored in the volatile memory.

2. The method according to claim 1, wherein loading the new content of the redundant row into the volatile memory comprises the re-loading the new content into the volatile memory following the writing of the redundant row.

3. The method according to claim 1, wherein the volatile memory comprises a random access memory.

4. The method according to claim 1, wherein the volatile memory comprises a page buffer.

5. The method according to claim 1, wherein the non-volatile memory comprises a memory configured such that a defective row does not affect functionality of other rows.

6. The method according to claim 1, wherein the non-volatile memory comprises rows and columns of memory cells, each column of memory cells comprising a plurality of twin pairs of memory cells comprising a common selection gate, each column of memory cells comprising two bit lines, wherein twin adjacent memory cells of the same column are not connected to the same bit line and wherein non-twin adjacent memory cells of the same column are connected to the same bit line.

7. A method for managing operation of a non-volatile memory that is erasable by page and is equipped with a row redundancy mechanism, the method comprising:
    receiving an instruction to write first content to a defective row of a memory plane of the non-volatile memory;
    loading the first content into a buffer memory of the non-volatile memory, the buffer memory being a volatile memory;
    writing the first content from the buffer memory into a redundant row associated with the defective row by the row redundancy mechanism;
    receiving an instruction to write second content to a functional row of the memory plane;
    loading the second content to the buffer memory;
    writing the second content from the buffer memory into the functional row;
    each time after writing a content into any functional row, re-loading the first content to the buffer memory;
    after re-loading the first content to the buffer memory, receiving a read command for the redundant row; and
    in response to the read command, reading the first content from the buffer memory.

8. The method according to claim 7, wherein, in response to the instruction to write the first content to the defective row and after writing the first content from the buffer memory into the redundant row, the method further comprises re-loading the first content to the buffer memory.

9. The method according to claim 7, wherein the buffer memory comprises a random access memory.

10. The method according to claim 7, wherein the non-volatile memory comprises a memory configured such that a defective row does not affect functionality of other rows.

11. The method according to claim 7, wherein the non-volatile memory comprises rows and columns of memory cells, each column of memory cells comprising a plurality of twin pairs of memory cells comprising a common selection gate, each column of memory cells comprising two bit lines, wherein twin adjacent memory cells of the same column are not connected to the same bit line and wherein non-twin adjacent memory cells of the same column are connected to the same bit line.

12. The method according to claim 7, the method further comprising:
    determining that the defective row is defective;
    storing an address of the defective row in a non-volatile register memory;
    associating the redundant row with the defective row; and
    assigning a new address memory to the redundant row.

13. A memory device, comprising:
a non-volatile memory that is erasable by page;
a row redundancy mechanism comprising a first non-volatile register;
a volatile memory; and
a controller configured to:
   upon detection of a defective row of a memory plane of the non-volatile memory, store an address of the defective row in the first non-volatile register;
   upon an attempt to write to the defective row, authorize a write to a redundant row;
   when writing to the redundant row, cause new content of the redundant row to be stored in the volatile memory;
   following each operation for writing to any other row of the memory plane, causing the new content of the redundant row to be re-stored in the volatile memory; and
   when a read command is issued for the redundant row, enabling the volatile memory to be read so that the new content of the redundant row stored in the volatile memory can be read.

14. The memory device according to claim 13, wherein the controller is also configured to cause the new content to be re-loaded into the volatile memory after the redundant row has been written to.

15. The memory device according to claim 13, further comprising read amplifiers usable during read operations in the non-volatile memory, wherein the controller comprises a multiplexer having a first input connected to the non-volatile memory and a second input connected to the volatile memory.

16. The memory device according to claim 15, wherein the controller further comprises a control block configured to select the second input in a selection time shorter than an implementation time of the read amplifiers in response to a read command of the redundant row.

17. The memory device according to claim 13, wherein the volatile memory comprises a random access memory.

18. The memory device according to claim 13, wherein the volatile memory comprises a page buffer.

19. The memory device according to claim 13, wherein the non-volatile memory is a memory configured such that the defective row does not affect functionality of other rows of the non-volatile memory.

20. The memory device according to claim 13, wherein the non-volatile memory comprises a non-volatile memory with rows and columns of memory cells, the columns of memory cells comprising twin pairs of memory cells comprising a common selection gate, each column of memory cells comprising two bit lines.

21. The memory device according to claim 20, wherein twin adjacent memory cells of the same column are not connected to the same bit line and wherein non-twin adjacent memory cells of the same column are connected to the same bit line.

22. The method according to claim 1, wherein detecting the defective row of the memory plane of the non-volatile memory comprises:
   performing an erase operation upon the defective row; and
   determining that a cell of the defective row is not erased.

23. The memory device according to claim 13, wherein the row redundancy mechanism is enabled or disabled based on a second non-volatile register.

* * * * *